(12) United States Patent
Khlat et al.

(10) Patent No.: US 9,207,692 B2
(45) Date of Patent: Dec. 8, 2015

(54) TRANSITIONING FROM ENVELOPE TRACKING TO AVERAGE POWER TRACKING

(71) Applicant: RF Micro Devices, Inc., Greensboro, NC (US)

(72) Inventors: Nadim Khlat, Cugnaux (FR); Michael R. Kay, Summerfield, NC (US); Mohammad Ahsanul Adeeb, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/056,292

(22) Filed: Oct. 17, 2013

(65) Prior Publication Data

US 2014/0111178 A1    Apr. 24, 2014

Related U.S. Application Data

(60) Provisional application No. 61/715,512, filed on Oct. 18, 2012.

(51) Int. Cl.
*H04B 1/04* (2006.01)
*G05F 1/46* (2006.01)
(Continued)

(52) U.S. Cl.
CPC ............... *G05F 1/46* (2013.01); *H03F 1/0211* (2013.01); *H03F 1/0227* (2013.01); *H03F 3/189* (2013.01);
(Continued)

(58) Field of Classification Search
CPC ........................................................ G05F 1/46
USPC ............... 455/127.1, 67.13, 522; 330/127
See application file for complete search history.

(56) References Cited

U.S. PATENT DOCUMENTS 3,969,682 A   7/1976  Rossum
3,980,964 A   9/1976  Grodinsky
(Continued)

FOREIGN PATENT DOCUMENTS

CN   1211355 A   3/1999
CN   1518209 A   8/2004
(Continued)

OTHER PUBLICATIONS

Final Office Action for U.S. Appl. No. 13/297,470, mailed Oct. 25, 2013, 17 pages.
(Continued)

*Primary Examiner* — Sanh Phu
(74) *Attorney, Agent, or Firm* — Withrow & Terranova, P.L.L.C.

(57) ABSTRACT

An envelope tracking power supply and an offset capacitive element are disclosed. The offset capacitive element is coupled between a switching output and an analog output of the envelope tracking power supply, which operates in one of an envelope tracking mode, a transition mode, and an average power tracking mode. During the envelope tracking mode, the envelope tracking power supply provides an envelope power supply signal using both the switching output and the analog output. During the transition mode, the envelope tracking power supply drives a voltage across the offset capacitive element from a first voltage to a second voltage, such that during a transition from the envelope tracking mode to the transition mode, the offset capacitive element has the first voltage, and during a transition from the transition mode to the average power tracking mode, the offset capacitive element has the second voltage.

28 Claims, 6 Drawing Sheets

(51) Int. Cl.
  *H03F 1/02* (2006.01)
  *H03F 3/189* (2006.01)
  *H03F 3/24* (2006.01)

(52) U.S. Cl.
  CPC ............ *H03F 3/24* (2013.01); *H03F 2200/102* (2013.01); *H03F 2200/432* (2013.01); *H04B 2001/0441* (2013.01)

(56) References Cited

U.S. PATENT DOCUMENTS

| | | | |
|---|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 * | 3/2008 | Whittaker ..................... 330/250 |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |

(56) References Cited

U.S. PATENT DOCUMENTS

| | | |
|---|---|---|
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |

(56) References Cited

U.S. PATENT DOCUMENTS

| | | |
|---|---|---|
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0306769 A1 | 10/2014 | Khlat et al. |
| 2015/0048891 A1 | 2/2015 | Rozek et al. |

FOREIGN PATENT DOCUMENTS

| | | |
|---|---|---|
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.

(56) References Cited

OTHER PUBLICATIONS

Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%/20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.

(56) References Cited

OTHER PUBLICATIONS

Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Notice of Allowance for U.S. Appl. No. 14/072,140, mailed Dec. 2, 2014, 8 pages.
First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Feb. 11, 2015, 7 pages.
First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.

(56) References Cited

OTHER PUBLICATIONS

International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Search Report for European Patent Application No. 14190851.7, issued Mar. 5, 2015, 6 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
Notice of Allowance for U.S. Appl. No. 13/747,725, mailed Oct. 28, 2015, 9 pages.
Final Office Action for U.S. Appl. No. 14/163,256, mailed Nov. 2, 2015, 10 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.

\* cited by examiner

TRANSITIONING FROM ENVELOPE TRACKING TO AVERAGE POWER TRACKING

RELATED APPLICATIONS

This application claims the benefit of U.S. provisional patent application No. 61/715,512, filed Oct. 18, 2012, the disclosure of which is hereby incorporated herein by reference in its entirety.

FIELD OF THE DISCLOSURE

Embodiments of the present disclosure relate to switching power supplies and radio frequency (RF) power amplifier (PA)s, both of which may be used in RF communication systems.

BACKGROUND

RF communication systems may use RF PAs to provide RF transmit signals. Power levels of the RF transmit signals may be relatively high to achieve required transmit distances. As such, for high efficiency, the RF communication systems may use switching power supplies to provide power for amplification to the RF PAs. Further, at high output power levels, the RF PAs and the switching power supplies may utilize envelope tracking of the RF transmit signals to maximize efficiency. In envelope tracking, a switching power supply provides an envelope power supply signal to an RF PA. The envelope power supply signal at least partially envelope tracks an envelope of an RF transmit signal, which is provided by the RF PA. However, at low output power levels from the RF PA, the RF PA and the switching power supply may use average power tracking instead of envelope tracking. In average power tracking, the envelope power supply signal is held at a constant magnitude. The magnitude of the envelope power supply signal may be adjusted as an average output power from the RF PA is adjusted.

In this regard, when the average output power from the RF PA is relatively high, the RF PA and the switching power supply may use envelope tracking. Conversely, when the average output power from the RF PA is relatively low, the RF PA and the switching power supply may use average power tracking. However, in certain situations, when transitioning from envelope tracking to average power tracking, the switching power supply may introduce a disruption into the envelope power supply signal. Such a disruption may interfere with proper operation of the RF PA. Thus, there is a need to reduce or eliminate disruptions of an envelope power supply signal when transitioning from envelope tracking to average power tracking.

SUMMARY

An envelope tracking power supply and an offset capacitive element are disclosed. The offset capacitive element is coupled between a switching output and an analog output of the envelope tracking power supply, which operates in one of an envelope tracking mode, a transition mode, and an average power tracking mode. During the envelope tracking mode, the envelope tracking power supply provides an envelope power supply signal using both the switching output and the analog output. During the transition mode, the envelope tracking power supply drives a voltage across the offset capacitive element from a first voltage to a second voltage, such that during a transition from the envelope tracking mode to the transition mode, the offset capacitive element has the first voltage, and during a transition from the transition mode to the average power tracking mode, the offset capacitive element has the second voltage.

If the envelope tracking power supply transitions directly from the envelope tracking mode to the average power tracking mode, the offset capacitive element could cause a voltage dip in the envelope power supply signal. Therefore, in one embodiment of the envelope tracking power supply, the envelope tracking power supply transitions from the envelope tracking mode to the transition mode and then transitions from the transition mode to the average power tracking mode. The transition mode is used to change the voltage across the offset capacitive element to provide a smooth transition from the envelope tracking mode to the average power tracking mode.

In one embodiment of the present disclosure, during the envelope tracking mode and during the average power tracking mode, an RF PA receives and amplifies an RF input signal to provide an RF transmit signal using the envelope power supply signal. In one embodiment of the envelope tracking power supply, during the envelope tracking mode, the envelope power supply signal provides power for amplification and at least partially envelope tracks the RF transmit signal.

In one embodiment of the envelope tracking power supply, the envelope tracking power supply further includes a parallel amplifier, such that an output from the parallel amplifier is coupled to the analog output. In one embodiment of the envelope tracking power supply, the envelope tracking power supply further includes a switching supply, such that an output from the switching supply is coupled to the switching output. In one embodiment of the envelope tracking power supply, during the envelope tracking mode, the parallel amplifier regulates a voltage of the envelope power supply signal based on a setpoint of the envelope power supply signal. In one embodiment of the envelope tracking power supply, during the envelope tracking mode, the switching supply drives an output current from the parallel amplifier toward zero to maximize efficiency. In one embodiment of the envelope tracking power supply, during the average power tracking mode, the parallel amplifier is disabled.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
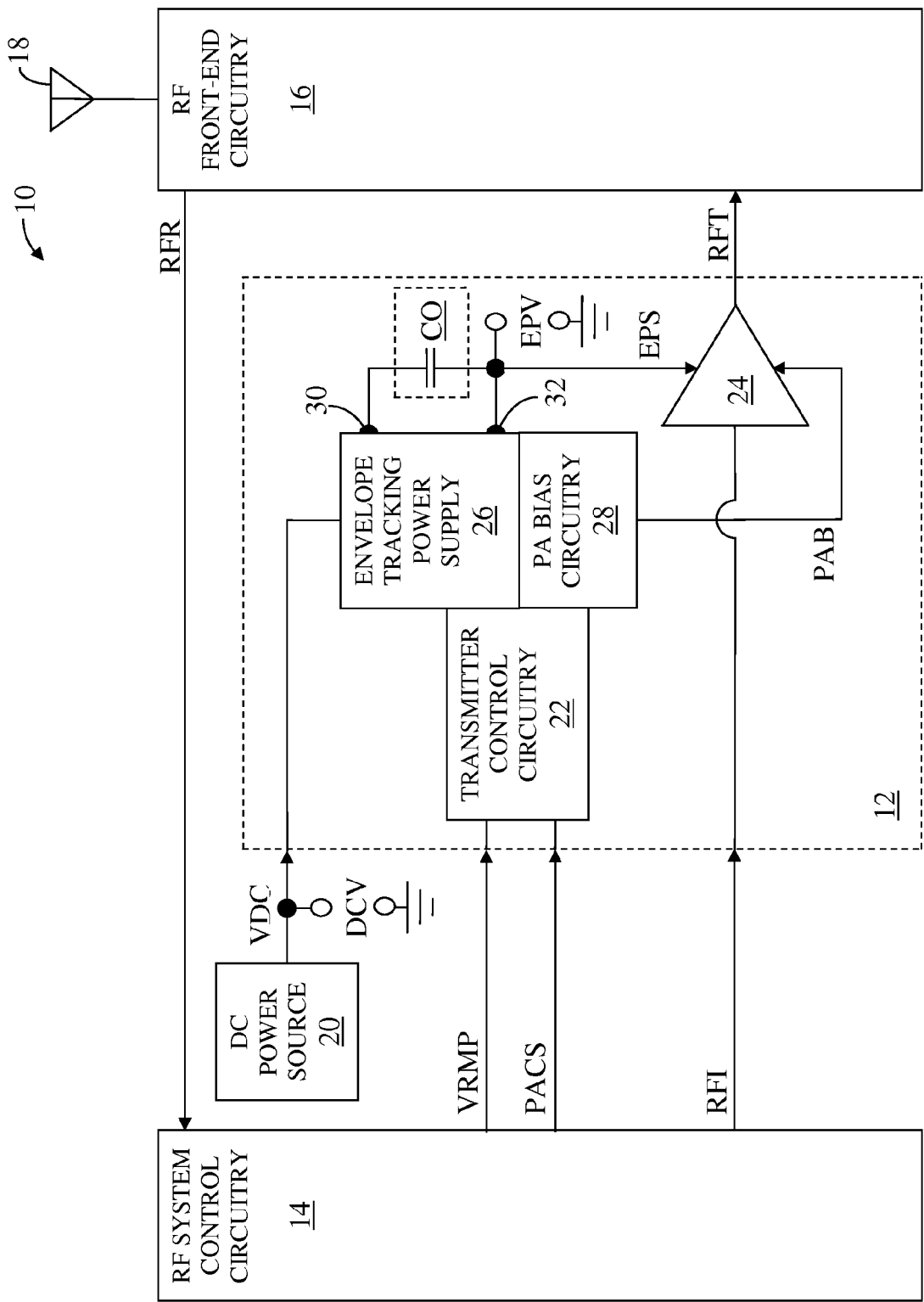
FIG. 1 shows an RF communications system according to one embodiment of the RF communications system.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

An envelope tracking power supply and an offset capacitive element are disclosed. The offset capacitive element is coupled between a switching output and an analog output of the envelope tracking power supply, which operates in one of an envelope tracking mode, a transition mode, and an average power tracking mode. During the envelope tracking mode, the envelope tracking power supply provides an envelope power supply signal using both the switching output and the analog output. During the transition mode, the envelope tracking power supply drives a voltage across the offset capacitive element from a first voltage to a second voltage, such that during a transition from the envelope tracking mode to the transition mode, the offset capacitive element has the first voltage, and during a transition from the transition mode to the average power tracking mode, the offset capacitive element has the second voltage.

If the envelope tracking power supply transitions directly from the envelope tracking mode to the average power tracking mode, the offset capacitive element could cause a voltage dip in the envelope power supply signal. Therefore, in one embodiment of the envelope tracking power supply, the envelope tracking power supply transitions from the envelope tracking mode to the transition mode and then transitions from the transition mode to the average power tracking mode. The transition mode is used to change the voltage across the offset capacitive element to provide a smooth transition from the envelope tracking mode to the average power tracking mode.

In one embodiment of the present disclosure, during the envelope tracking mode and during the average power tracking mode, an RF PA receives and amplifies an RF input signal to provide an RF transmit signal using the envelope power supply signal. In one embodiment of the envelope tracking power supply, during the envelope tracking mode, the envelope power supply signal provides power for amplification and at least partially envelope tracks the RF transmit signal.

In one embodiment of the envelope tracking power supply, the envelope tracking power supply further includes a parallel amplifier, such that an output from the parallel amplifier is coupled to the analog output. In one embodiment of the envelope tracking power supply, the envelope tracking power supply further includes a switching supply, such that an output from the switching supply is coupled to the switching output. In one embodiment of the envelope tracking power supply, during the envelope tracking mode, the parallel amplifier regulates a voltage of the envelope power supply signal based on a setpoint of the envelope power supply signal. In one embodiment of the envelope tracking power supply, during the envelope tracking mode, the switching supply drives an output current from the parallel amplifier toward zero to maximize efficiency. In one embodiment of the envelope tracking power supply, during the average power tracking mode, the parallel amplifier is disabled.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, PA bias circuitry 28, and an offset capacitive element CO. The envelope tracking power supply 26 has an analog output 30 and a switching output 32. The offset capacitive element CO is coupled between the switching output 32 and the analog output 30 and has an offset voltage OV (FIG. 6C) across the offset capacitive element CO.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22.

Control circuitry selects one of an envelope tracking mode, a transition mode, and an average power tracking mode. In one embodiment of the RF communications system 10, the RF system control circuitry 14 includes the control circuitry. As such, the transmitter configuration signal PACS is indicative of the selection of the one of the envelope tracking mode, a transition mode, and an average power tracking mode. In an alternate embodiment of the RF communications system 10, the transmitter control circuitry 22 includes the control circuitry that selects the one of the envelope tracking mode, the transition mode, and the average power tracking mode. In one embodiment of the control circuitry, the control circuitry selects the average power tracking mode when an average output power from the RF PA 24 is less than a power threshold.

The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery. The DC source signal VDC has a DC source voltage DCV. The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The envelope power supply signal EPS has an envelope power supply voltage EPV. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS.

During both the envelope tracking mode and the average power tracking mode, the RF PA 24 receives and amplifies the RF input signal RFI to provide an RF transmit signal RFT using the envelope power supply signal EPS. The envelope power supply signal EPS provides power for amplification. In one embodiment of the RF communications system 10, during the envelope tracking mode, the envelope power supply signal EPS at least partially envelope tracks the RF transmit signal RFT. In one embodiment of the RF communications system 10, during the average power tracking mode the envelope power supply voltage EPV is about equal to the DC source voltage DCV.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS. The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the envelope tracking power supply 26, the envelope tracking power supply 26 operates in the selected one of the envelope tracking mode, the transition mode, and the average power tracking mode. During the envelope tracking mode, the envelope tracking power supply 26 provides the envelope power supply signal EPS using the switching output 32 and the analog output 30. During the transition mode, the envelope tracking power supply 26 drives a voltage across the offset capacitive element CO, which is the offset voltage OV (FIG. 6C), from a first voltage 60 (FIG. 6C) to a second voltage 62 (FIG. 6C), such that during a transition from the envelope tracking mode to the transition mode, the offset capacitive element CO has the first voltage 60 (FIG. 6C), and during a transition from the transition mode to the average power tracking mode, the offset capacitive element CO has the second voltage 62 (FIG. 6C).

In one embodiment of the envelope tracking power supply 26, during the average power tracking mode, the analog output 30 has about zero volts. In one embodiment of the envelope tracking power supply 26, during the envelope tracking mode, the envelope tracking power supply 26 regulates the voltage across the offset capacitive element CO to be about equal to an offset voltage setpoint. It may be noted that during the envelope tracking mode, regulation of the voltage across the offset capacitive element CO is independent of regulation of the envelope power supply signal EPS.

During the both the envelope tracking mode and the average power tracking mode, the envelope tracking power supply 26 regulates the envelope power supply signal EPS to be about equal to the setpoint of the envelope power supply signal EPS. However, in one embodiment of the envelope tracking power supply 26, during the average power tracking mode, the analog output 30 has about zero volts. As such, during the average power tracking mode, the envelope power supply voltage EPV is regulated based on the setpoint of the envelope power supply signal EPS and the envelope power supply voltage EPV is about equal to the voltage across the offset capacitive element CO. In this regard, during the average power tracking mode, the voltage across the offset capacitive element CO is not separately regulated.

Figure 2:
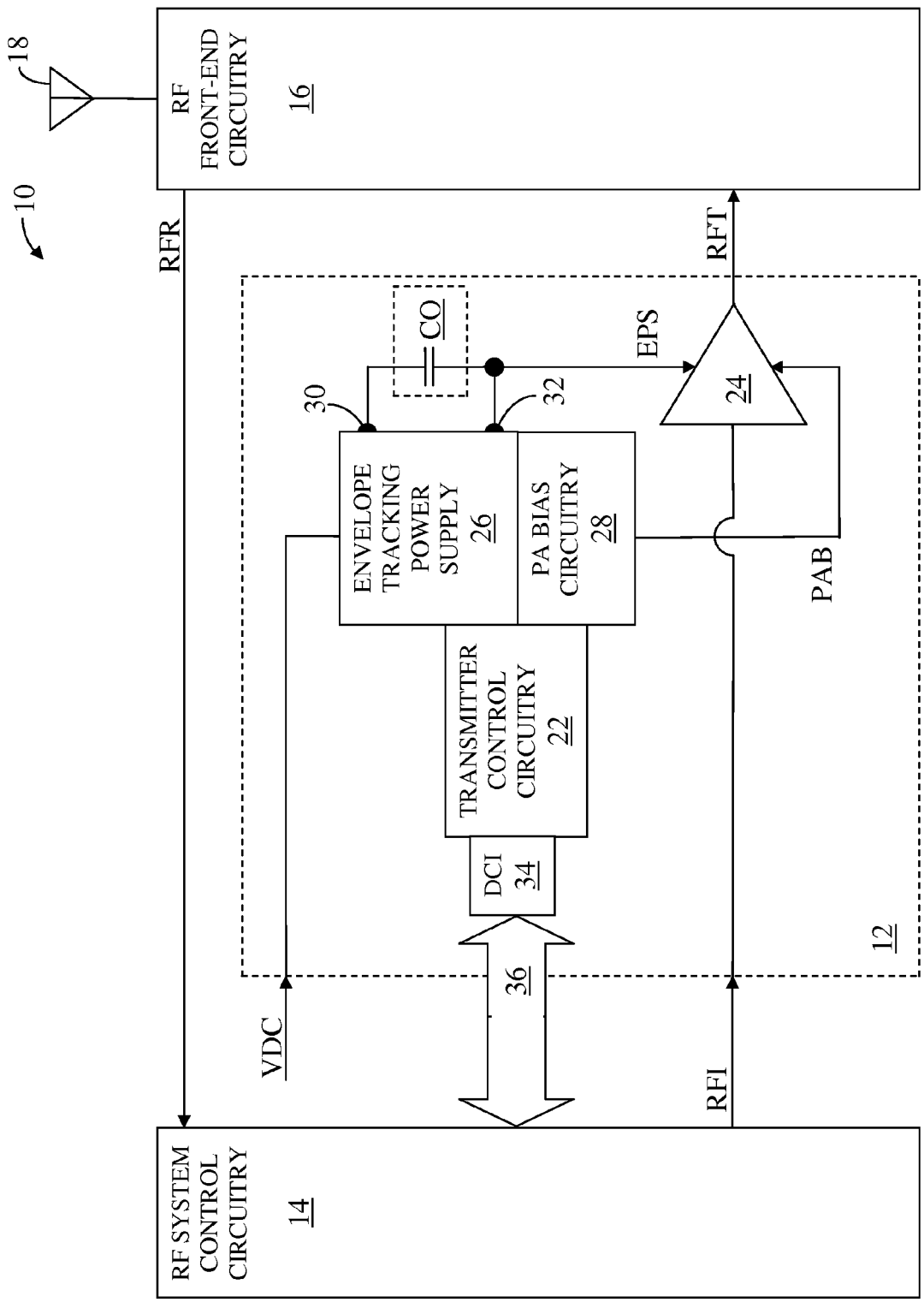
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 34, which is coupled between the transmitter control circuitry 22 and a digital communications bus 36. The digital communications bus 36 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 36 and the digital communications interface 34.

Figure 3:
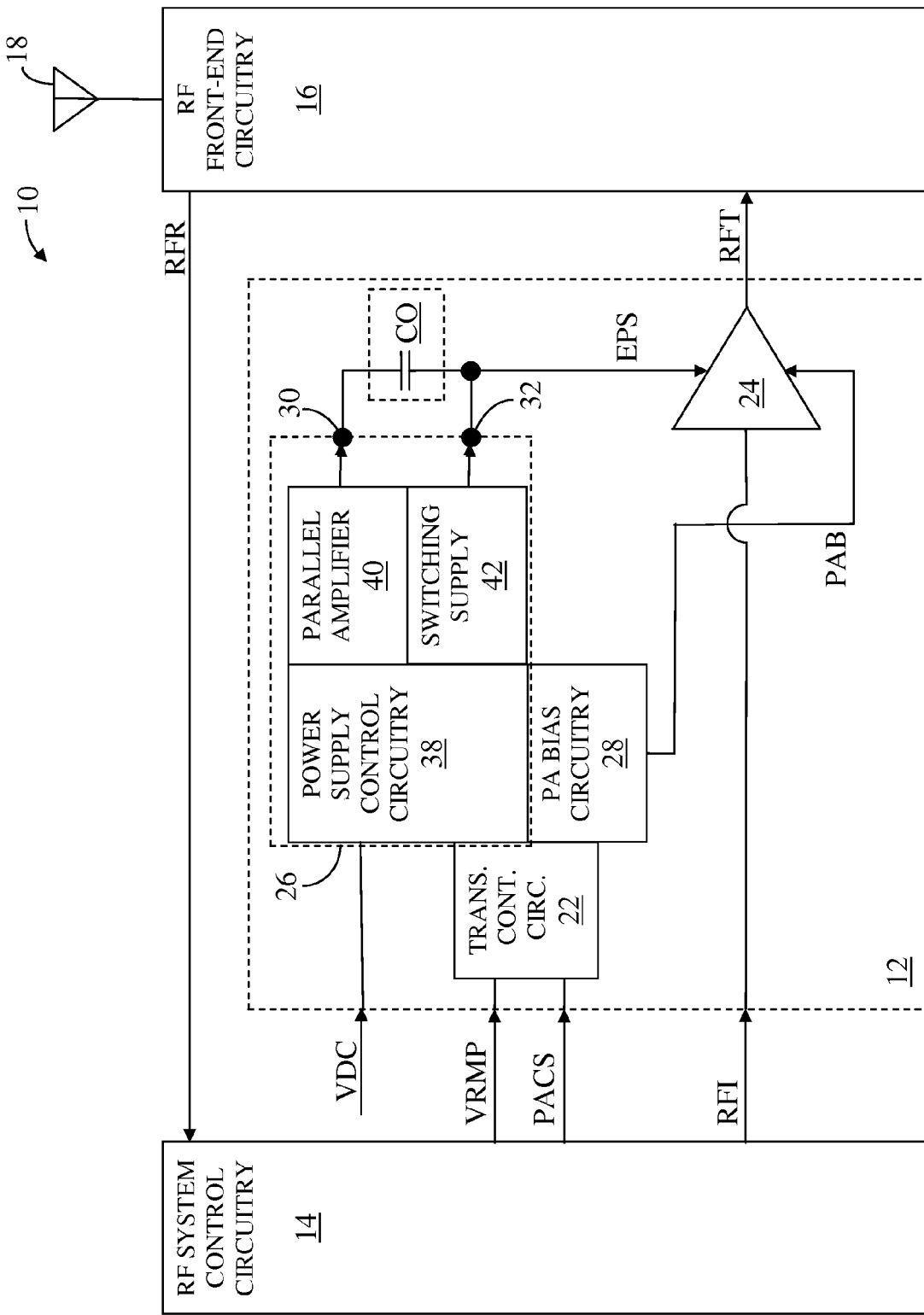
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 38, a parallel amplifier 40, and a switching supply 42. An output from the parallel amplifier 40 is coupled to the analog output 30 and an output from the switching supply 42 is coupled to the switching output 32. The output from the parallel amplifier 40 has a parallel amplifier output voltage PAV (FIG. 6B). The power supply control circuitry 38 controls the parallel amplifier 40 and the switching supply 42.

During the envelope tracking mode, the parallel amplifier 40 and the switching supply 42 provide the envelope power supply signal EPS, such that the parallel amplifier 40 partially provides the envelope power supply signal EPS and the switching supply 42 partially provides the envelope power supply signal EPS. The switching supply 42 may provide power more efficiently than the parallel amplifier 40. However, the parallel amplifier 40 may provide the envelope power supply signal EPS more accurately than the switching supply 42. As such, during the envelope tracking mode, the parallel amplifier 40 regulates a voltage of the envelope power supply signal EPS based on the setpoint of the envelope power supply signal EPS, and the switching supply 42 operates to drive an output current from the parallel amplifier 40 toward zero to maximize efficiency. In this regard, the parallel amplifier 40 behaves like a voltage source and the switching supply 42 behaves like a current source.

In one embodiment of the envelope tracking power supply 26, during the transition mode, the parallel amplifier 40 drives the analog output 30 to be about equal to a ground. Further, in one embodiment of the envelope tracking power supply 26, during the average power tracking mode, the analog output 30 has about zero volts.

Figure 4:
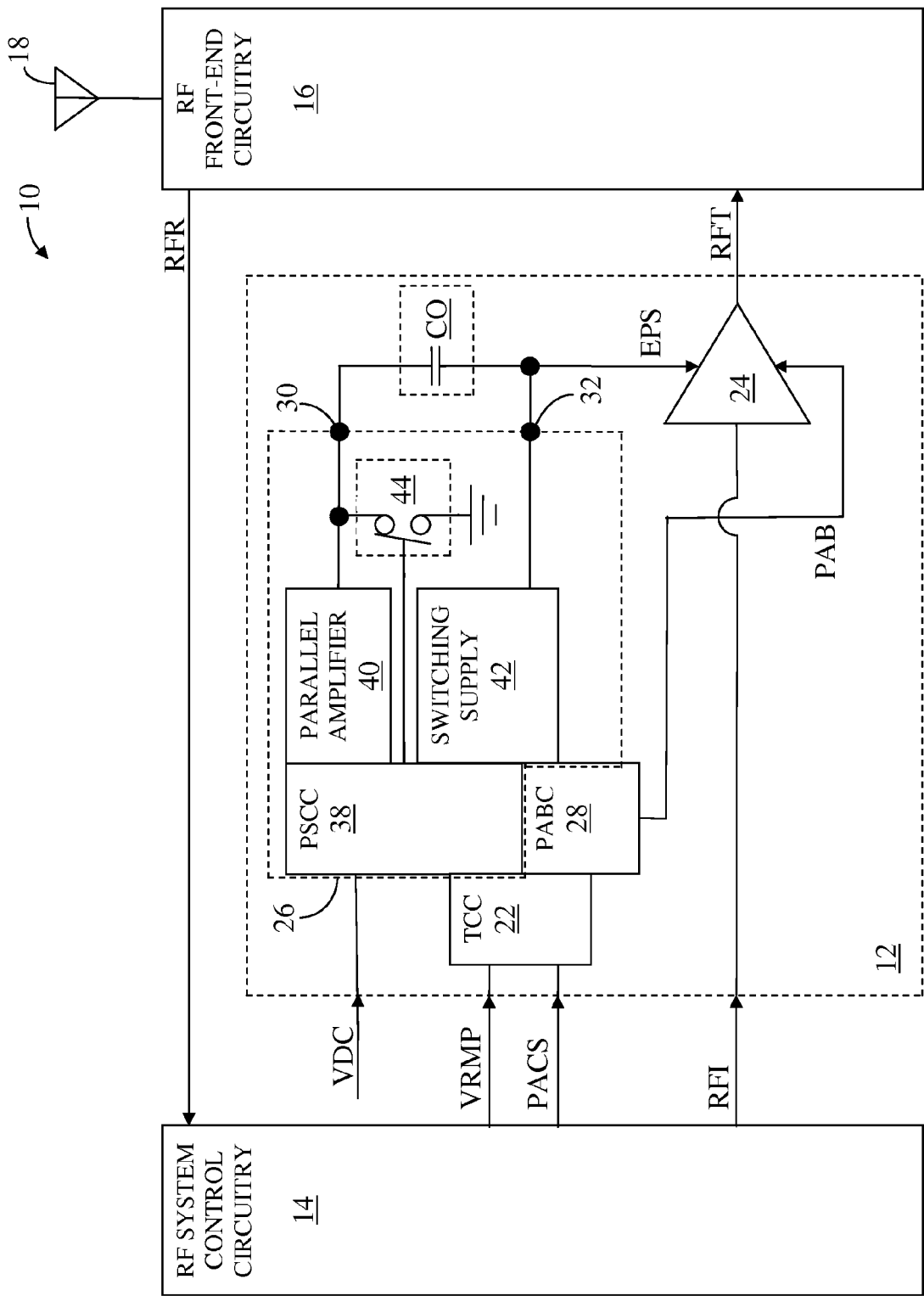
FIG. 4 shows details of the envelope tracking power supply illustrated in FIG. 1 according to an alternate embodiment of the envelope tracking power supply.

FIG. 4 shows details of the envelope tracking power supply 26 illustrated in FIG. 1 according to an alternate embodiment of the envelope tracking power supply 26. The envelope tracking power supply 26 illustrated in FIG. 4 is similar to the envelope tracking power supply 26 illustrated in FIG. 3, except the envelope tracking power supply 26 illustrated in FIG. 4 further includes a switching element 44 coupled between the analog output 30 and the ground. In one embodiment of the envelope tracking power supply 26, during the average power tracking mode, the switching element 44 couples one end of the offset capacitive element CO to ground. As such, during the average power tracking mode, the parallel amplifier 40 is disabled, which may increase efficiency.

In one embodiment of the envelope tracking power supply 26, during the envelope tracking mode, the switching element 44 is in an OFF state and the parallel amplifier 40 is enabled. After the transition from the envelope tracking mode to the transition mode, the parallel amplifier 40 drives the analog output 30 toward about zero volts, such that the during the transition mode, the analog output 30 has about zero volts, which is about equal to ground. After the analog output 30 is about equal to ground, the switching element 44 transitions from the OFF state to an ON state, thereby driving the analog output 30 to ground. In one embodiment of the envelope tracking power supply 26, after the switching element 44 transitions from the OFF state to the ON state, the parallel amplifier 40 is disabled. In one embodiment of the envelope tracking power supply 26, before the envelope tracking power supply 26 transitions from the average power tracking mode to the envelope tracking mode, the switching element 44 transitions from the ON state to the OFF state. However, in one embodiment of the parallel amplifier 40, before the switching element 44 transitions from the ON state to the OFF state, the parallel amplifier 40 is enabled. In an alternate embodiment of the parallel amplifier 40, after the switching element 44 transitions from the ON state to the OFF state, the parallel amplifier 40 is enabled.

Figure 5:
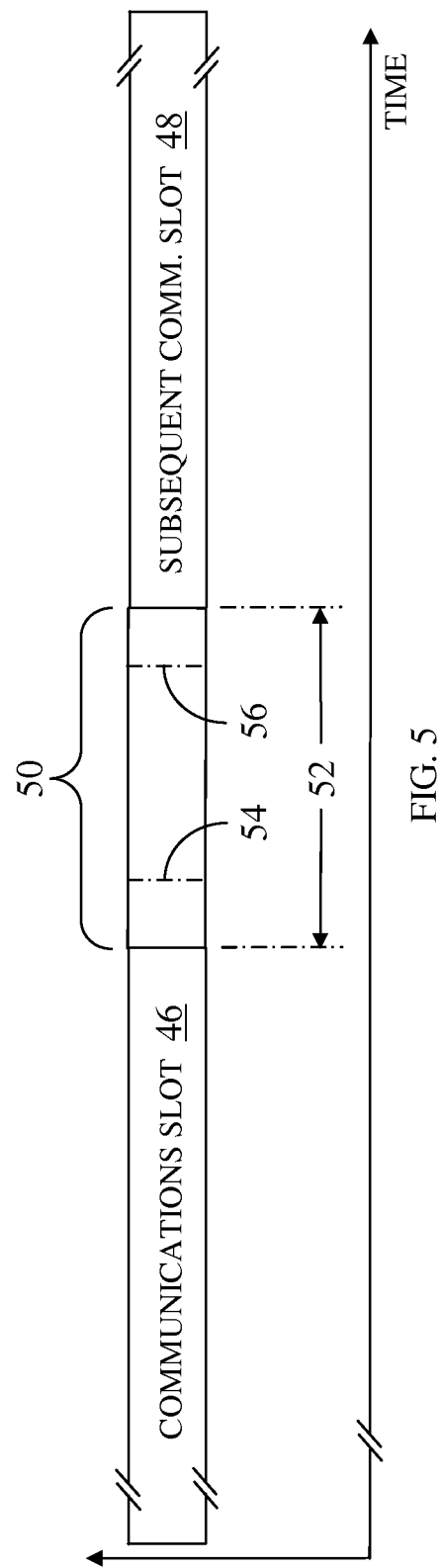
FIG. 5 is a graph illustrating operation of the RF communications system illustrated in FIG. 4 according to one embodiment of the RF communications system.

FIG. 5 is a graph illustrating operation of the RF communications system 10 illustrated in FIG. 4 according to one embodiment of the RF communications system 10. The RF communications system 10 may transmit, receive, or both, during communications slots. As such, FIG. 5 illustrates a timing relationship between a communications slot 46 and a subsequent communications slot 48. A transition slot boundary 50 is between the communications slot 46 and the subsequent communications slot 48. As such, the communications slot 46 occurs before the transition slot boundary 50, which occurs before the subsequent communications slot 48. The transition slot boundary 50 has a transition slot boundary duration 52.

The envelope tracking power supply 26 (FIG. 4) operates in the envelope tracking mode during the communications slot 46. As such, in general, the envelope tracking power supply 26 (FIG. 4) operates in the envelope tracking mode during a communications slot prior and adjacent to the transition slot boundary 50. Further, the envelope tracking power supply 26 (FIG. 4) operates in the average power tracking mode during the subsequent communications slot 48. As such, in general, the envelope tracking power supply 26 (FIG. 4) operates in the average power tracking mode during a communications slot after and adjacent to the transition slot boundary 50. During the transition slot boundary 50, the envelope tracking power supply 26 (FIG. 4) has an envelope tracking mode-to-transition mode transition 54, which is followed by a transition mode-to-average power tracking mode transition 56.

The transition from the envelope tracking mode to the transition mode is the envelope tracking mode-to-transition mode transition 54. The transition from the transition mode to the average power tracking mode is the transition mode-to-average power tracking mode transition 56. The envelope tracking power supply 26 (FIG. 4) operates in the envelope tracking mode during the transition slot boundary 50 prior to the envelope tracking mode-to-transition mode transition 54. As such, in general, the envelope tracking power supply 26 (FIG. 4) operates in the envelope tracking mode during the transition slot boundary 50 prior to the transition from the envelope tracking mode to the transition mode. The envelope tracking power supply 26 (FIG. 4) operates in the average power tracking mode during the transition slot boundary 50 after the transition mode-to-average power tracking mode transition 56. In general, the envelope tracking power supply 26 (FIG. 4) operates in the average power tracking mode during the transition slot boundary 50 after the transition from the transition mode to the average power tracking mode.

In one embodiment of the envelope tracking power supply 26 (FIG. 4), during the subsequent communications slot 48, the switching element 44 (FIG. 4) is in the ON state. In general, during a communications slot after and adjacent to the transition slot boundary 50, the switching element 44 (FIG. 4) is in the ON state. In one embodiment of the envelope tracking power supply 26 (FIG. 4), during the communications slot 46, the switching element 44 (FIG. 4) is in the OFF state. In general, during a communications slot prior and adjacent to the transition slot boundary 50, the switching element 44 (FIG. 4) is in the OFF state. In one embodiment of the envelope tracking power supply 26 (FIG. 4), during the subsequent communications slot 48, the parallel amplifier 40 (FIG. 4) is disabled. In general, during a communications slot after and adjacent to the transition slot boundary 50, the parallel amplifier 40 (FIG. 4) is disabled.

Figure 6A:
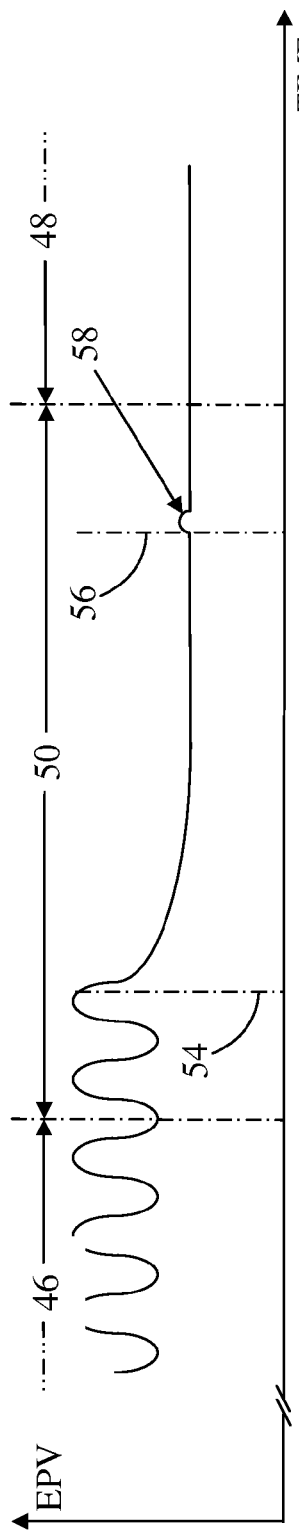
FIG. 6A is a graph illustrating an envelope power supply voltage shown in FIG. 1 according to one embodiment of the envelope power supply voltage.
Figure 6B:
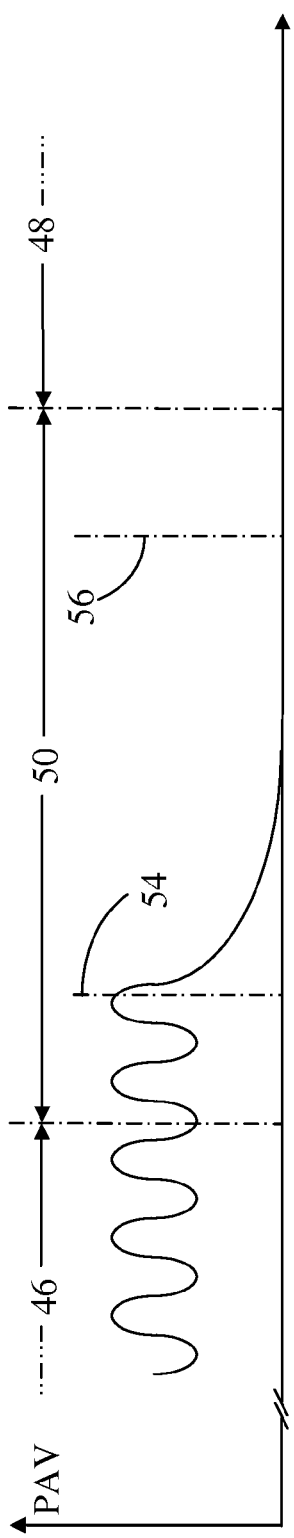
FIG. 6B is a graph illustrating a parallel amplifier output voltage described regarding FIG. 3 according to one embodiment of the parallel amplifier output voltage.
Figure 6C:
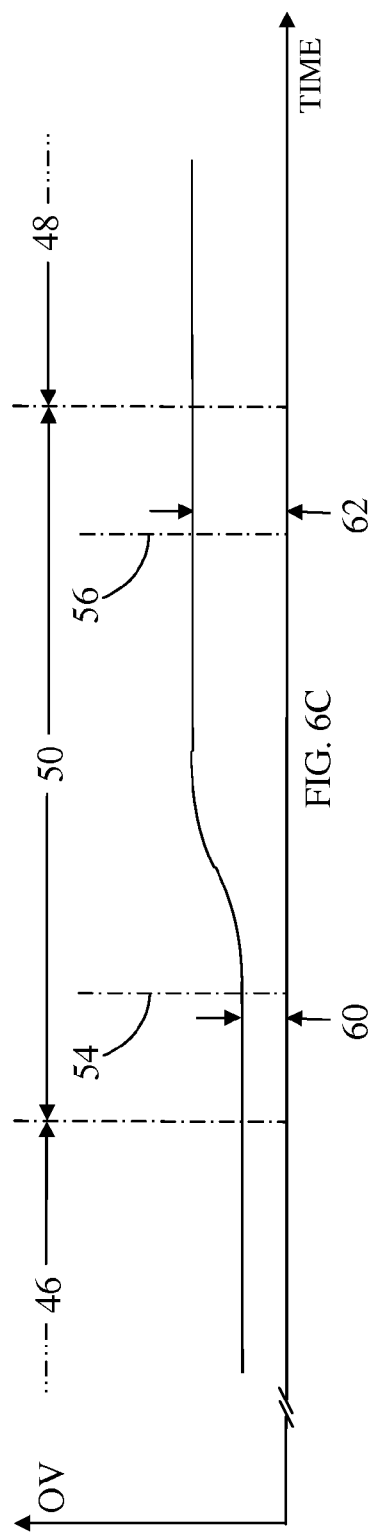
FIG. 6C is a graph illustrating an offset voltage described regarding FIG. 1 according to one embodiment of the offset voltage.

FIG. 6A is a graph illustrating an envelope power supply voltage EPV shown in FIG. 1 according to one embodiment of the envelope power supply voltage EPV. FIG. 6B is a graph illustrating a parallel amplifier output voltage PAV described regarding FIG. 3 according to one embodiment of the parallel amplifier output voltage PAV. FIG. 6C is a graph illustrating an offset voltage OV described regarding FIG. 1 according to one embodiment of the offset voltage OV. The graphs illustrated in FIGS. 6A, 6B, and 6C are shown relative to the communications slot 46, the subsequent communications slot 48, the transition slot boundary 50, the envelope tracking mode-to-transition mode transition 54, and the transition mode-to-average power tracking mode transition 56 illustrated in FIG. 5.

Regarding FIG. 6A, during the communications slot 46 and during the transition slot boundary 50 prior to the envelope tracking mode-to-transition mode transition 54, the envelope tracking power supply 26 (FIG. 1) regulates the envelope power supply voltage EPV based on the setpoint of the envelope power supply signal EPS (FIG. 1). During the transition slot boundary 50 after the envelope tracking mode-to-transition mode transition 54 and before the transition mode-to-average power tracking mode transition 56, the envelope tracking power supply 26 (FIG. 1) drives the envelope power supply voltage EPV toward the second voltage 62 (FIG. 6C). Upon the transition mode-to-average power tracking mode transition 56, as the envelope tracking power supply 26 (FIG. 1) starts controlling in the average power tracking mode, the envelope power supply voltage EPV may have a possible small glitch 58.

After the transition mode-to-average power tracking mode transition 56, the envelope tracking power supply 26 (FIG. 1) operates in the average power tracking mode. As such, the envelope tracking power supply 26 (FIG. 1) regulates the envelope power supply voltage EPV based on the setpoint of the envelope power supply signal EPS (FIG. 1). In one embodiment of the envelope tracking power supply 26 (FIG. 1), during the subsequent communications slot 48, the envelope tracking power supply 26 (FIG. 1) drives the analog output 30 (FIG. 1) to be about equal to the ground. As such, during the subsequent communications slot 48, the envelope power supply voltage EPV is about equal to the second voltage 62 (FIG. 6C).

Regarding FIG. 6B, during the communications slot 46 and during the transition slot boundary 50 prior to the envelope tracking mode-to-transition mode transition 54, the envelope tracking power supply 26 (FIG. 1) regulates the parallel amplifier output voltage PAV and the offset voltage OV (FIG. 6C) based on the setpoint of the envelope power supply signal EPS (FIG. 1). During the transition slot boundary 50 after the envelope tracking mode-to-transition mode transition 54 and before the transition mode-to-average power tracking mode transition 56, the envelope tracking power supply 26 (FIG. 1)

drives the parallel amplifier output voltage PAV toward the ground. After the parallel amplifier output voltage PAV is about equal to the ground, the switching element 44 (FIG. 4) transitions from the OFF state to the ON state. After the switching element 44 (FIG. 4) is in the ON state, the parallel amplifier 40 (FIG. 4) is disabled.

Regarding FIG. 6C, during the communications slot 46 and during the transition slot boundary 50 prior to the envelope tracking mode-to-transition mode transition 54, the envelope tracking power supply 26 (FIG. 1) regulates the offset voltage OV to be about equal to the first voltage 60. During the transition slot boundary 50 after the envelope tracking mode-to-transition mode transition 54 and before the transition mode-to-average power tracking mode transition 56, the envelope tracking power supply 26 (FIG. 1) drives the offset voltage OV to be about equal to the second voltage 62. In this regard, during the average power tracking mode, the offset voltage OV follows and is about equal to the envelope power supply voltage EPV (FIG. 6A).

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    an offset capacitive element coupled between a switching output and an analog output; and
    an envelope tracking power supply having the switching output and the analog output, and configured to:
        operate in one of an envelope tracking mode, a transition mode, and an average power tracking mode;
        during the envelope tracking mode, provide an envelope power supply signal using the switching output and the analog output, wherein the envelope power supply signal at least partially envelope tracks an RF transmit signal;
        during the transition mode, drive a voltage across the offset capacitive element from a first voltage to a second voltage; and
        during the average power tracking mode, provide the envelope power supply signal, which is about equal to the second voltage, wherein:
            during a transition from the envelope tracking mode to the transition mode, the offset capacitive element has the first voltage; and
            during a transition from the transition mode to the average power tracking mode, the offset capacitive element has the second voltage.

2. The circuitry of claim 1 wherein the envelope tracking power supply is further configured to:
    during a communications slot prior and adjacent to a transition slot boundary, operate in the envelope tracking mode;
    during a communications slot after and adjacent to the transition slot boundary, operate in the average power tracking mode; and
    during the transition slot boundary, operate in the envelope tracking mode prior to the transition from the envelope tracking mode to the transition mode; and
    during the transition slot boundary, operate in the average power tracking mode after the transition from the transition mode to the average power tracking mode.

3. The circuitry of claim 2 wherein:
    the envelope power supply signal has an envelope power supply voltage; and
    during the transition slot boundary and prior to the transition from the envelope tracking mode to the transition mode, the envelope tracking power supply is further configured to regulate the envelope power supply voltage based on a setpoint of the envelope power supply signal.

4. The circuitry of claim 2 wherein during the transition slot boundary and prior to the transition from the envelope tracking mode to the transition mode, the envelope tracking power supply is further configured to regulate the voltage across the offset capacitive element to be about equal to the first voltage.

5. The circuitry of claim 2 wherein during the communications slot after and adjacent to the transition slot boundary, the envelope tracking power supply is further configured to drive the analog output to be about equal to a ground.

6. The circuitry of claim 5 wherein:
    the envelope power supply signal has an envelope power supply voltage; and
    during the communications slot after and adjacent to the transition slot boundary, the envelope tracking power supply is further configured to regulate the envelope power supply voltage to be about equal to the second voltage.

7. The circuitry of claim 5 wherein:
    the envelope tracking power supply comprises a switching element coupled between the analog output and the ground; and
    during the communications slot after and adjacent to the transition slot boundary, the switching element is configured to be in an ON state.

8. The circuitry of claim 7 wherein during the communications slot prior and adjacent to the transition slot boundary, the switching element is further configured to be in an OFF state.

9. The circuitry of claim 5 wherein:
    the envelope tracking power supply comprises a parallel amplifier, such that an output from the parallel amplifier is coupled to the analog output; and
    during the communications slot after and adjacent to the transition slot boundary, the parallel amplifier is configured to be disabled.

10. The circuitry of claim 1 wherein:
    the envelope tracking power supply comprises a parallel amplifier, such that an output from the parallel amplifier is coupled to the analog output; and
    during the transition mode, the parallel amplifier is configured to drive the analog output to be about equal to a ground.

11. The circuitry of claim 10 wherein:
    the envelope tracking power supply further comprises a switching element coupled between the analog output and the ground; and during the transition mode and after the analog output is about equal to the ground, the switching element is configured to transition from an OFF state to an ON state.

12. The circuitry of claim 11 wherein after the transition from the OFF state to the ON state, the parallel amplifier is further configured to be disabled.

13. The circuitry of claim 1 wherein during the average power tracking mode, the analog output has about zero volts.

14. The circuitry of claim 1 wherein the envelope tracking power supply comprises a parallel amplifier, such that an output from the parallel amplifier is coupled to the analog output.

15. The circuitry of claim 14 wherein during the average power tracking mode, the parallel amplifier is configured to be disabled.

16. The circuitry of claim 14 wherein during the envelope tracking mode, the parallel amplifier is configured to regulate a voltage of the envelope power supply signal based on a setpoint of the envelope power supply signal.

17. The circuitry of claim 14 wherein the envelope tracking power supply further comprises a switching supply, such that an output from the switching supply is coupled to the switching output.

18. The circuitry of claim 17 wherein during the envelope tracking mode, the switching supply is configured to drive an output current from the parallel amplifier toward zero.

19. The circuitry of claim 17 wherein during the envelope tracking mode, the parallel amplifier is configured to partially provide the envelope power supply signal and the switching supply is configured to partially provide the envelope power supply signal.

20. The circuitry of claim 1 further comprising a radio frequency power amplifier configured to during the envelope tracking mode and during the average power tracking mode, receive and amplify a radio frequency input signal to provide a radio frequency transmit signal using the envelope power supply signal.

21. The circuitry of claim 20 wherein during the envelope tracking mode, the envelope power supply signal provides power for amplification and at least partially envelope tracks the radio frequency transmit signal.

22. The circuitry of claim 1 wherein:
the envelope power supply signal has an envelope power supply voltage; and
during the average power tracking mode, the envelope power supply voltage is about equal to a direct current source voltage.

23. The circuitry of claim 1 wherein control circuitry is configured to select the one of the envelope tracking mode, the transition mode, and the average power tracking mode.

24. The circuitry of claim 23 wherein radio frequency system control circuitry comprises the control circuitry.

25. The circuitry of claim 23 further comprising the control circuitry.

26. The circuitry of claim 23 wherein the control circuitry is further configured to select the average power tracking mode when an average output power from a radio frequency power amplifier is less than a power threshold.

27. The circuitry of claim 1 wherein during the envelope tracking mode, the envelope tracking power supply is further configured to regulate the voltage across the offset capacitive element to be about equal to an offset voltage setpoint.

28. A method comprising:
providing an offset capacitive element coupled between a switching output and an analog output; and
operating in one of an envelope tracking mode, a transition mode, and an average power tracking mode;
during the envelope tracking mode, providing an envelope power supply signal using the switching output and the analog output, wherein the envelope power supply signal at least partially envelope tracks an RF transmit signal;
during the transition mode, driving a voltage across the offset capacitive element from a first voltage to a second voltage; and
during the average power tracking mode, providing the envelope power supply signal, which is about equal to the second voltage, wherein
during a transition from the envelope tracking mode to the transition mode, the offset capacitive element has the first voltage; and
during a transition from the transition mode to the average power tracking mode, the offset capacitive element has the second voltage.

\* \* \* \* \*